United States Patent [19]
Peng et al.

[11] Patent Number: 5,894,148
[45] Date of Patent: Apr. 13, 1999

[54] FLOATING GATE FPGA CELL WITH COUNTER-DOPED SELECT DEVICE

[75] Inventors: Jack Zezhong Peng, San Jose; Robert U. Broze, Santa Cruz; Kyung Joon Han, Cupertino; Victor Levchenko, Gilroy, all of Calif.

[73] Assignee: GateField Corporation, Fremont, Calif.

[21] Appl. No.: 08/708,074

[22] Filed: Aug. 9, 1996

[51] Int. Cl.$^6$ .................................................. H01L 29/788
[52] U.S. Cl. .................... 257/316; 257/319; 257/321
[58] Field of Search ........................ 257/315, 316, 257/321, 322, 319, 320; 365/185.26, 185.28, 185.29

[56] References Cited

U.S. PATENT DOCUMENTS

| | | | |
|---|---|---|---|
| 4,302,766 | 11/1981 | Guterman et al. | 257/315 |
| 4,317,273 | 3/1982 | Guterman et al. | 257/315 |
| 4,435,790 | 3/1984 | Tickle et al. | 257/315 |
| 5,293,328 | 3/1994 | Amin et al. | 257/315 |
| 5,633,518 | 5/1997 | Broze | 257/316 |

*Primary Examiner*—Sara Crane
*Attorney, Agent, or Firm*—Townsend and Townsend and Crew LLP; Henry K. Woodward

[57] ABSTRACT

The present invention provides for an improved EPROM transistor cell which forms the programming portion of the programmable interconnect interconnect of an FPGA integrated circuit, and a method of manufacturing the EPROM cell. The EPROM cell has a floating gate disposed over a P region of the substrate. Aligned with one edge of the floating gate and at the surface of the substrate is a lightly doped P– region; on the opposite edge of the floating gate is a heavily doped N+ region. A control gate lies over the P–, P substrate and over the N+ region. N+ regions are formed at the opposite edges of the control gate. One N+ region is contiguous to the P– region and forms the source of the EPROM cell and the other N+ region is connected to the N+ region under the control gate and forms the drain of the EPROM cell. This structure allows for easy process control of the $V_T$ of the access transistor formed by the control gate and the P– surface, and of the space charge region formed by the P substrate and the N+ drain of the EPROM cell.

9 Claims, 4 Drawing Sheets

FLOATING GATE FPGA CELL WITH COUNTER-DOPED SELECT DEVICE

BACKGROUND OF THE INVENTION

The present invention is related to field programmable integrated circuits, and more particularly, to Field Programmable Gate Arrays (FPGAs).

Typically, an FPGA has an array of logic elements and wiring interconnections with many thousands, or even hundreds of thousands, of programmable interconnects so that the FPGA can be configured by the user into an integrated circuit with defined functions. Each programmable interconnect can connect two circuit nodes in the integrated circuit to make (or break) a wiring interconnection, or to set the function or functions of a logic element.

FPGAs use either memory cells or antifuses for the programmable switches. The memory cells are reprogrammable and antifuses are programmable only once. In U.S. Ser. No. 08/270,714, entitled, "A GENERAL PURPOSE, NON-VOLATILE REPROGRAMMABLE SWITCH," filed Jul. 5, 1994 by Robert J. Lipp, Richard D. Freeman, Robert U. Broze, John M. Caywood, and Joseph G. Nolan, III, and assigned to the present assignee, a new memory-type of programmable interconnect is disclosed. The described FPGA programmable interconnect has a non-volatile memory (NVM) cell, which is reprogrammable, to provide a general purpose switching element to randomly interconnect the FPGA wiring and circuit elements.

The present invention provides for an improvement in the disclosed programmable interconnect. In particular, the process of manufacturing the programming portion of the programmable interconnect is improved with the resulting programming element, an EPROM transistor cell, having improved electrical operating parameters.

SUMMARY OF THE INVENTION

The present invention provides for an improved programming element of an FPGA interconnect cell. The programming element has a first P-type dopant region in the integrated circuit substrate extending to a principal surface of the substrate. A first gate electrode oxide layer lies on the substrate surface over the first P-type dopant region and a first gate electrode lies on the first gate electrode oxide layer to form a floating gate for the FPGA cell. A second P-type dopant region which is substantially aligned with an edge of the first gate electrode lies in the first P-type dopant region. The second P-type dopant region is more lightly doped than the first P-type dopant region. A first N-type dopant region which is substantially aligned with the opposite edge of the first gate electrode lies in the first P-type dopant region. A second gate electrode oxide layer covers the first gate electrode and a second gate electrode lies over the second gate electrode oxide layer and extends over the second P-type dopant region. The second gate electrode forms a control gate for the first gate electrode and a gate for an access or switching device. The second gate electrode has an edge over the first N-type dopant region and a second edge over the second P-type dopant region. A second N-type dopant region which is substantially aligned with the second edge of the second gate electrode, lies in the first P-type region. The second and first N-type regions are connected to respectively form a source and drain for said programming portion of the FPGA cell.

The present invention also provides for a method of manufacturing an FPGA cell in a substrate of an integrated circuit. A first P-type dopant region is formed in the substrate extending to a principal surface of the substrate and a first gate electrode oxide layer is formed on the substrate surface over the P-type dopant region. Then a first gate electrode is formed on the first gate electrode oxide layer, and second and third P-type dopant regions are created on either side of, and self-aligned with, the first gate electrode in the P-type dopant region by counterdoping these regions with N-type dopants. The second and third regions become more lightly doped than the first P-type dopant region. The second P-type dopant region is covered with a masking material with the third P-type dopant region exposed. Then a first N-type dopant region is created on one side of, and self-aligned with, the first gate electrode in the P-type dopant region. A second gate electrode oxide layer is then deposited over the substrate and the first gate electrode. A second gate electrode is formed over the second gate electrode oxide layer. Then a second N-type dopant region, which is aligned with one side of the second gate electrode and opposite the first N-type dopant region, is created. The first and second N-type dopant regions are the drain and source regions of the resulting programming portion of the FPGA interconnect cell.

DETAILED DESCRIPTION OF PREFERRED EMBODIMENTS

Figure 1:
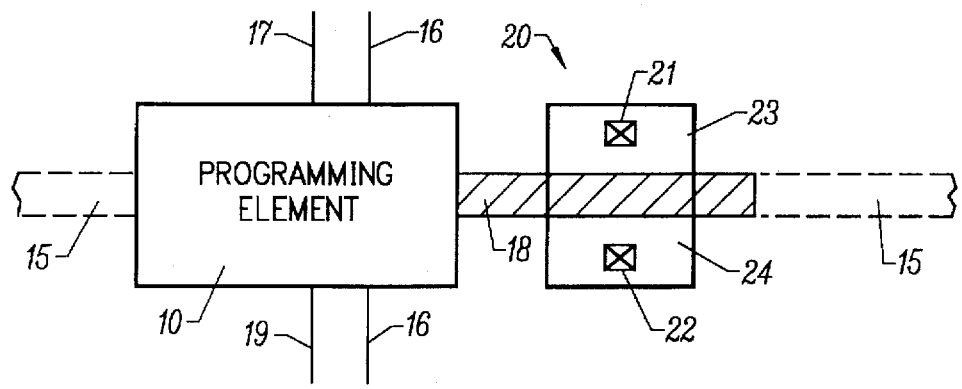
FIG. 1 is a representative top view of a programmable interconnect.

FIG. 1 illustrates the general organization of a programmable interconnect cell described in the above-mentioned patent application. The cell has two elements, a programming element 10 and a switching element 20. The switching element 20 is illustrated by a simplified integrated circuit layout representation and the programming element 10 by a black box representation.

The switching element 20 can be considered a simple MOS transistor having source/drains regions 23 and 24 separated by a gate. Depending upon the charge of the gate, the source/drains regions 23 and 24 are either connected to, or isolated from, each other. A source/drain region 23 of the switching element 20, formed by an impurity diffusion into the substrate of the integrated circuit, is connected by a contact 21 to other nodes of the integrated circuit. Similarly, the source/drain region 24, another impurity diffusion into the substrate of the integrated circuit, is connected to other nodes through a contact 22. Thus the switching element 20 can connect (or disconnect) two circuit nodes in the integrated circuit to make (or break) a wiring interconnection, or to set the function or functions of a logic element.

The switching element 20 is connected to the programming element 10 which sets the state of the switching element. As shown in FIG. 1, a control gate 15 and a floating gate 18 physically and electrically connect the switching and programming elements 20 and 10. The control gate 15 is shown by dotted lines where the gate 15 continues beyond the floating gate 18. The control gate 15 overlies the floating gate 18 in the area of the switching element 20. The control gate 15 continues into the programming element 10, and to other circuitry on the integrated circuit (not shown).

The programming element 10 adds or subtracts electrical charges from the floating gate 18 which it shares with the switching element 20. The floating gate 18 is not directly connected to any other circuit element and stores the programmed state of the programmable interconnect by the presence or lack of electrical charges on the floating gate 18. To operate, the programming element 10 is connected to programming control lines 17–16, 19 and the control gate 15. As shown by the FIG. 2 schematic representation of the programmable interconnect, the programming element 10 itself is formed by an EPROM transistor 32 and an FN erase device 31, each of which is coupled to the floating gate 18. The EPROM transistor 32 forms the programming portion and the FN erase device 31 forms the erasing portion of the programming element 10. In other words, the EPROM transistor 32 "programs" the programmable interconnect and the FN device 31 "erases" the programmable interconnect. Thus, the FN erase device 31 turns on the programmable switch 20 and the EPROM transistor 32 turns off the programmable switch 20.

In the context of NMOS NVM (non volatile memory) technology, an NVM transistor is erased or programmed by respectively adding or removing electrons from its floating gate. For an n-channel (NMOS) NVM transistor, if electrons are removed from the floating gate, the charge on the gate becomes more positive, turning the transistor on, i.e., reducing the impedance and permitting current to flow across the source-drain terminals of the transistor. This state is commonly referred to as the erased state. If electrons are added, the charge becomes more negative, programming the device by turning the transistor off, i.e., creating a high impedance between the source-drain terminals and inhibiting current flow. These responses make the NVM transistor act like switch. When the transistor is on, the switch is closed; when the transistor is off, the switch is open. For p-channel MOS (PMOS) NVM transistors, the response is similar, except that the polarity of the gate voltage controlling whether the transistor turns on or off is reversed.

Figure 2:
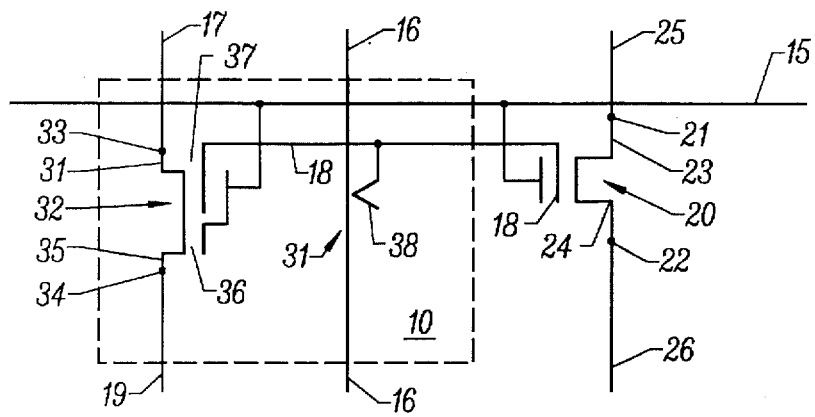
FIG. 2 is schematic circuit diagram of the programmable interconnect of FIG. 1.
Figure 3:
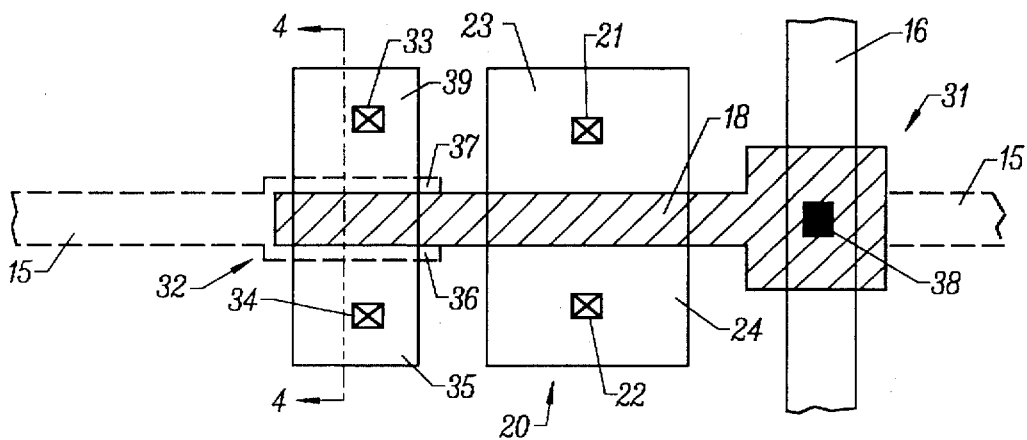
FIG. 3 is a detailed top view of the programmable interconnect FIG. 2.

FIG. 3 is a top view of an integrated circuit layout of the programmable interconnect diagrammed in FIG. 2. It should be noted that in the drawings the same reference numerals are used for the same elements in the different drawing formats to facilitate a better understanding of the invention. In this layout the switching element 20 is shown between the FN device 31 on the right and the EPROM transistor 32. At least in the region of the FN device 31, the programming control line 16 is represented by a substrate diffusion shown by a solid line. The diffusion underlies the floating gate 18 in the form of a polysilicon layer shaded by diagonal lines. The polysilicon floating gate 18 is, in turn, under the control gate 15, a polysilicon layer running horizontally in the drawing and outlined by dotted lines in areas removed from the floating gate 18. Above the floating gate 18, the control gate 15 is coextensive with the gate 18.

The FN tunnel region 38 in the FN device 31 is a thin oxide region underlying the floating gate 18 but overlying diffusion 26. The region 38 is represented by a solid square in the drawing. On the far left side of the FIG. 3 is the EPROM transistor 32. Note that the structure of the EPROM transistor is similar to that of the NMOS transistor forming the switching element 20, except that the control gate 15 extends beyond the floating gate 18 on two sides of the transistor to create the gate region 36. This figure clearly shows how the floating gate 18 is shared between all three elements, the switching element 20 and the two devices of the programming element 10, the FN tunnel device 31 and the EPROM transistor 32.

The voltage on the floating gate 18 is manipulated during programming and erase operations by applying a voltage to the control gate 15 which overlies the floating gate 18 and is capacitively coupled to it. The floating gate 18 is erased by electrons tunneling across an FN tunnel region 38 from the gate 18 to a programming control line 16 when a high positive voltage, with respect to the gate 18, is applied to the line 16. The control gate 15 is typically held at ground voltage during this operation to ensure that the voltage on the gate 18 is near ground potential. The voltage on the floating gate 18 is erased to a positive voltage with respect to ground.

To overcome the selection problem in charging the floating gate 18, the EPROM programming transistor 32 has a a gate region 36. The floating gate 18 is programmed by adding electrons to it by CHE (channel hot electron injection) in the EPROM transistor 32. In a programming operation, the control gate 15 is raised to a high voltage to turn on the transistor 32. The gate region 36, acting as a select device, is directly controlled by the control gate 15 while the gate region 37 of the transistor 32 is controlled by the floating gate 18. See FIG. 2. Both regions 36 and 37 are activated by a positive voltage with respect to the source region 35 of the transistor 32. As the floating gate 18 is capacitively coupled to the control gate 15, the rise in voltage on the gate 15 further raises the voltage on the floating gate 18 to ensure that the transistor 32 is turned on in the region 37 also. A high voltage on the programming control line 17 and a lower voltage on the line 19 causes a current to flow through the transistor 32, creating hot electrons, some of which are captured by the floating gate 18. These captured hot electrons charge the floating gate 18 negatively.

The charge on the gate 18 becomes so negative that, given sufficient time, the region 37 of transistor 32 is turned off and the transistor 32 stops conducting current. If sufficient time is allowed to fully charge the floating gate 18, its final charge is primarily a function of the voltage on the control gate 15 and the coupling ratio between the control gate 15 and the floating gate 18 (i.e., the percentage of all capacitance of the gate 28 which is coupled to the gate 25). CHE programming is a well understood phenomena and is not described further.

The programming control lines 17 and 19, and the control gate 15 are further connected to other programmable interconnects in the integrated circuit. Each EPROM transistor 32 typically is embedded in an orthogonal matrix of such devices which are uniquely addressed and selected by the gates 15 and programming control line 17 using well known memory addressing technology. The gate region 36 provides for the unique row address selection by the control gate 15. If the gate 15 is driven low, the transistor 32 is not activated, regardless of the voltage on the floating gate 18. Selectively driving the programming control line 17 provides for column address programming selection.

In a similar fashion, the programming control line 16 is also connected to other FN tunnel elements of other programmable interconnects in the integrated circuit. This permits erasing operations to be performed on all of the programmable interconnects at the same time.

Figure 4A:
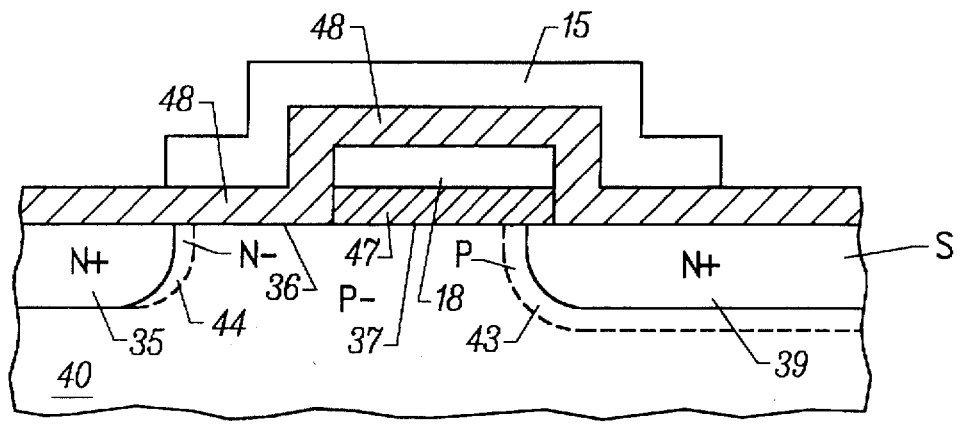
FIG. 4A is a cross-sectional sideview of the programming portion of the programmable interconnect of FIG. 3.

FIG. 4A is a cross-sectional side view of the EPROM transistor 32 along line 4–4' in FIG. 3. As shown in enlarged scale, the source region 35 of heavily doped N-type dopants is separated by channel regions 36 and 37 at the surface of the substrate 40 from the heavily doped N+ region 39. The region 39 is the drain region of the NVM transistor. Over the channel region 36 is a portion of the control gate 15, while the floating gate 18 lies over the region 37. A first gate oxide layer 47 separates the channel region 37 from the floating gate 18. A second gate oxide layer 48 separates a portion of the control gate 15 from the channel region 36. The gate oxide layer 48 also separates the floating gate 18 from the control gate 15.

Next to the source region 35 in the channel region 36, a lightly doped N– region 44 helps avoid breakdown at the source region 35. Around the drain region 39 is a P-type region 43 which aids in the programming of the floating gate 18. The more heavily doped region 43, as compared to the P– region of the substrate 40, narrows the space charge region formed by the drain 39 and the P-type substrate 40. This narrowing of the space charge region increases the strength of the electric field in this region to enhance CHE effects so that the electrons traveling from the source 35 to the drain 39 are more easily capable of traveling through the oxide layer 47 to the floating gate 18. The remainder of the channel regions 36 and 37 are formed by the P– substrate 40 (or at least a P– doped region where the EPROM transistor 32 is formed). The P– region ensures that the threshold voltage is low so that the regions 36 and 37 can be inverted, or turned on, for electrons to travel from the source 35 to the drain 39 during programming.

Figure 4B:
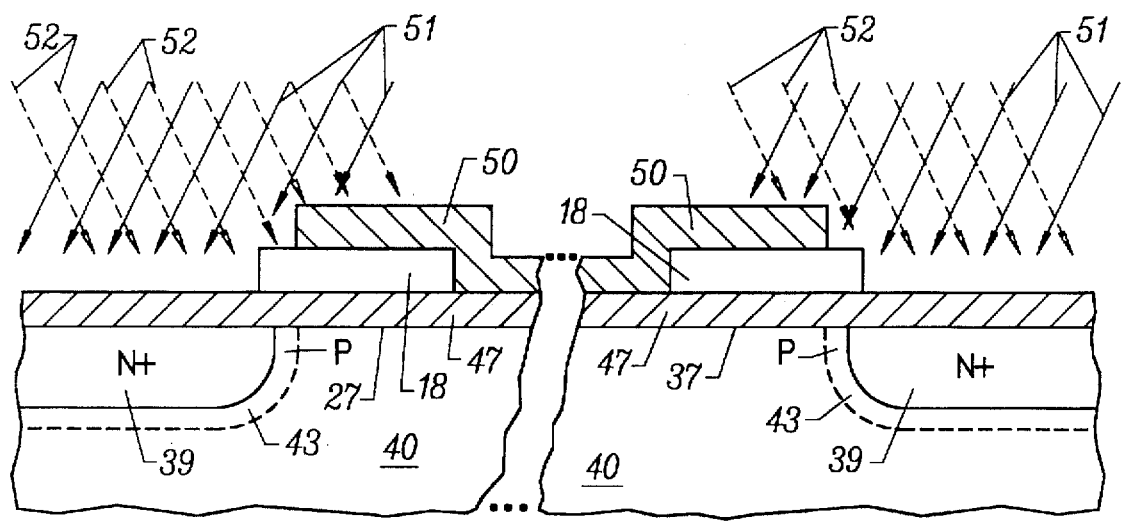
FIG. 4B is a cross-sectional sideview of the FIG. 4A programming at one stage of the manufacturing process.

To form the P– regions 43 around the drain regions 39, high energy angled implants of P-type dopants are performed. FIG. 4B illustrates the high energy implant steps, which are performed prior to the formation of the control gate 15. Two EPROM transistors of different programmable interconnects are arranged "back-to-back" so that their floating gates 18 are covered by a patterned resist layer 50. Then, high energy angled implants of P-type dopants are performed. FIG. 4B illustrates the same high energy implant steps. Solid arrows 51 indicate implants forming the region 43 under the control gate 18 for the EPROM transistor on the right side of the drawing. Dotted arrows 52 indicate the implant step to form the P region 43 for the left hand side EPROM transistor shown in FIG. 4B. Since the EPROM transistors can be arranged in all four directions on the surface of the integrated circuit, four high energy implant steps are performed in four directions. In FIG. 4B, the remaining two implant steps are angled into and out of the plane of the drawing.

The implant step which forms the P region 43 for the channel region 37 creates are problems. First, the high energy implant damages the gate oxide layer 47 beneath the floating gate 18. The damage to the floating gate oxide creates paths for leakage of the charge carriers off the floating gate 18 back into the substrate 40. This undesirably lessens the long term reliability of the programmable interconnect. Secondly, the high dose implant step lowers the breakdown voltage around the region 43. To get each of the EPROM transistors properly implanted under the floating gate 18, each transistor receives four times as much of implants as required.

Finally, it is difficult to control the threshold voltage $V_T$ of the select device, i.e., the field effect device formed by the control gate 15 and the channel region 36. The $V_T$ has a strong influence upon the programming voltage for the control gate 15 and the time to program the floating gate 18. In the described structure, the substrate region 40 (or at least the region in the substrate in which the EPROM transistor 32 is formed) is a P– region to keep $V_T$ low. However, the $V_T$ is determined not only by dopant levels in the substrate 40 but also by the thickness of the second gate oxide layer 48. This oxide thickness has a strong influence upon $V_T$. The problem is that the thickness of the second gate oxide layer not only defines the distance the control gate 15 is removed from the channel region 36, but also how far laterally the control gate 15 is removed from the channel region 37 due to the placement of the second gate oxide layer 48 along the sides of the control gate 15. Due to the vagaries of semiconductor processing, the implant steps to form the P region 43 allow the $V_T$ to vary widely between each of the EPROM transistors of the programmable interconnect cells. Thus programming voltages and times vary widely between cell to cell.

To avoid these problems, the present invention provides for an improved floating gate FPGA cell in which the select device of the EPROM transistor is counterdoped. FIGS. 5A–5G illustrate some of the manufacturing steps relevant to the formation of the EPROM transistor, according to the present invention. While different reference numerals have been used to point out the differences, it should be readily evident how the EPROM transistor described below replaces the EPROM transistor 32 above in the programming interconnect cell.

Figure 5A:
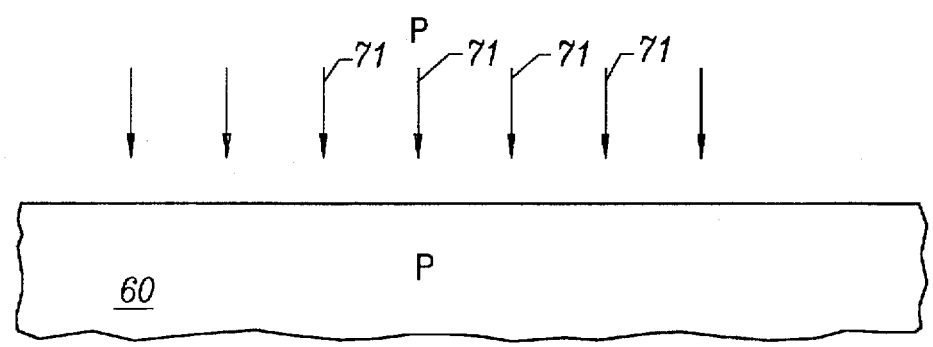
FIGS. 5A–5G are cross-sectional sideviews of the improved programming portion at different manufacturing stages according to the present invention.
Figure 5B:
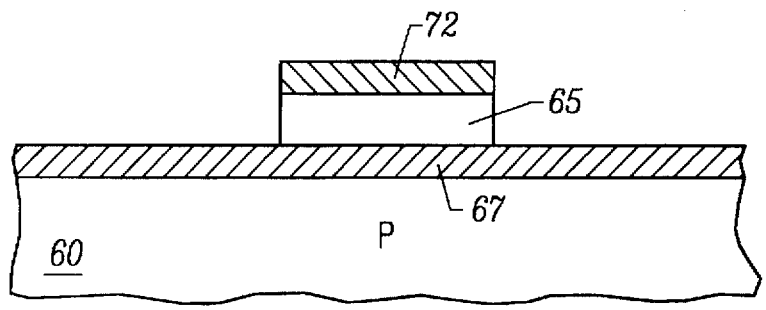
Figure 5C:
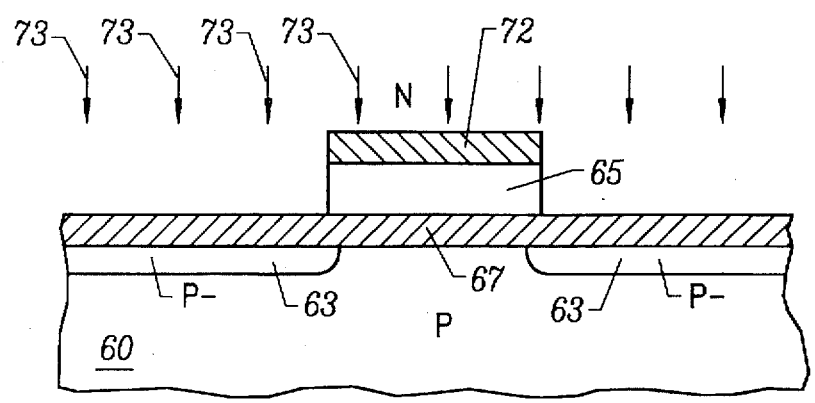
Figure 5D:
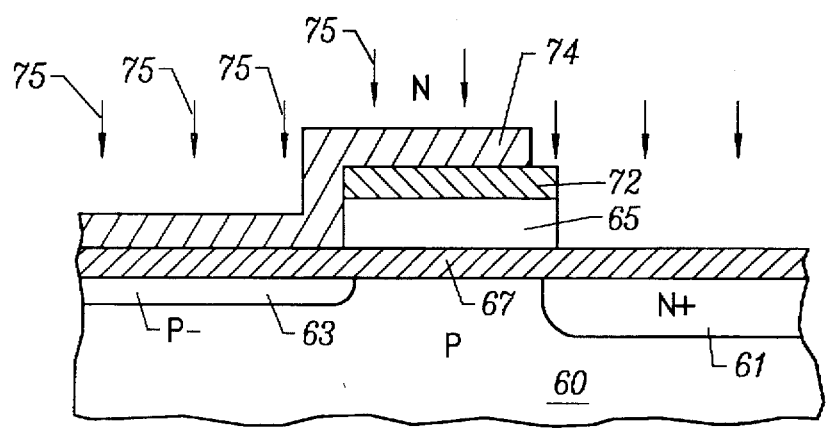

In FIG. 5A, a portion of the substrate 60 in which the EPROM transistor is to be formed is doped with P-type dopants by an implant shown by arrows 71. The amount of dopants is selected so that this area of the substrate has a dopant density of approximately $2 \times 10^{17}$ dopants per cubic centimeter. A first gate oxide layer 67 is then formed to a thickness between 200–400Å and the first polysilicon layer 65 is deposited thereover. A photoresist layer 72 is then deposited on the polysilicon layer 65 and developed by standard photolithographic techniques to form a floating gate electrode 65, as shown in FIG. 5B. Using the floating gate 65 and the defined photoresist layer 72, the surface of the substrate 60 is then counterdoped with N-type dopants, specifically, phosphorous. Arrows 73 illustrate the ion implantation step. This surface implant step creates P-type regions 63 in a dopant net concentration of $1 \times 10^{16}$ per cubic centimeter. The regions 63 are self-aligned with the edges of the floating gate 65. Then the side of the floating gate 65, which is to form the source, is masked by a photoresist layer 74, as shown in FIG. 5D. The unmasked side of the floating gate electrode 65 is exposed and undergoes a heavy ion implantation step of N-type dopants as shown by arrows 75. An N+ drain region 61 is then formed.

Figure 5E:
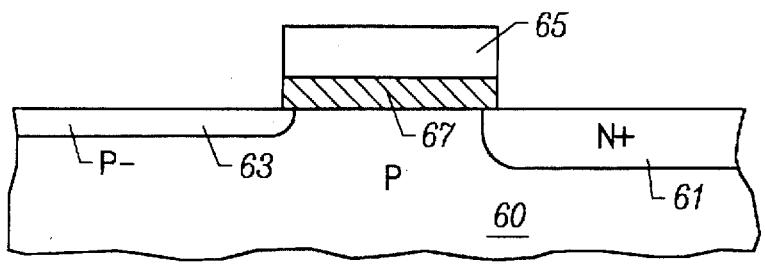
Figure 5F:
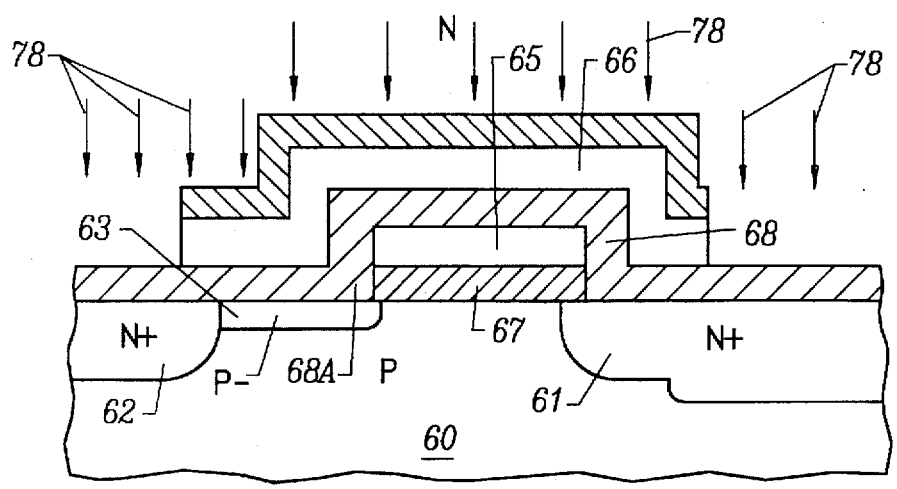

As shown in FIG. 5E, the photoresist layer 74 and 72 are then removed leaving behind the floating gate 65 and the first gate oxide layer 67. On one side of the floating gate 65 is a P– region 63; on the other side of the floating gate is a N+ region 61.

A second gate oxide layer 68 is then deposited over the surface of the substrate and over the floating gate 65. This is followed by a second layer of polysilicon which is formed into the control gate layer 66 by standard photolithographic techniques. Once the control gate 66 is delineated, another ion implant step of N-type dopants is performed. Arrows 79 show this implantation of N-type dopants which form the source region 62 in the drain region 61.

Figure 5G:
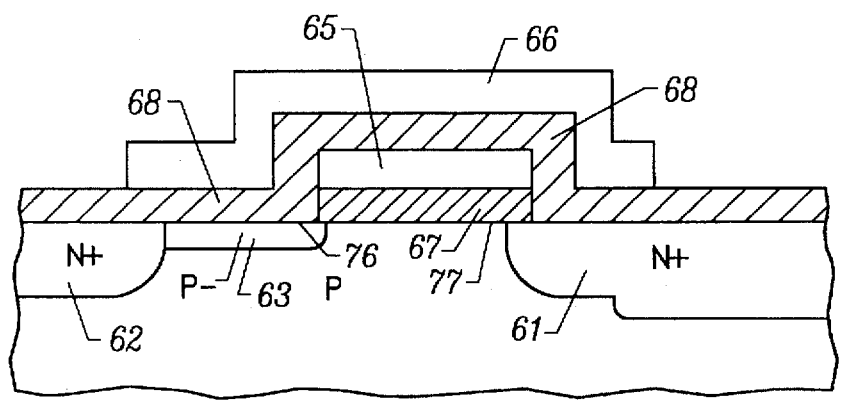

FIG. 5G shows the partially completed EPROM transistor according to the present invention. The transistor has a floating gate 65, over which is the control gate 66. The source region 62 and drain region 61 are separated by channel regions 77 and 76. The channel region 77 is formed at the interface between first gate oxide layer 67 and the P region of the substrate 60 and between the P– region 63 and the drain 61. The space charge region between the substrate 60 and the drain region 61 is independently controlled for CHE effects is determined by the implant step illustrated by FIG. 5A. The dopants are implanted uniformly for optimal effect since the implant is performed before the creation of the floating gate 65. Furthermore, the first oxide layer 67 is not subjected to implant damage; its integrity is not compromised.

The channel region 76 is formed at the interface between the second gate oxide layer 68 and the P– region 63. The $V_T$ for the access device formed by the portion of the control gate 66 over the P– region 63 can be controlled for optimum programming parameters. The region 63 is formed independently by the implant step illustrated in FIG. 5C. Moreover, the region 63 is self-aligned with respect to the control gate 65 and the doping concentration of the region 63 can determines the $V_T$ voltage also. The second gate oxide layer 68 can be deposited and set to a thickness to best enhance the programming capability of the EPROM transistor. Finally, the distance between the region 63 and the drain region 61, i.e., the precisely doped channel region 77 is clearly defined.

Thus all these factors allow programming parameters to be precisely determined. As described above, $V_T$ can be set 2V or less above to the source voltage, and drain source programming voltage $V_{DS}$ substantially equal to 4V.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. A programming element of an FPGA cell in a substrate of an integrated circuit, said programming element comprising a first first conductivity-type dopant region in said substrate extending to a principal surface of said substrate;

a first gate electrode oxide layer on said substrate surface over said first first conductivity-type dopant region;

a first gate electrode on said first gate electrode oxide layer forming a floating gate for said FPGA cell, said first gate electrode having a first edge and a second edge;

a second first conductivity-type dopant region in said substrate and abutting said first first-type dopant region and extending to the principal surface of the substrate, said second first conductivity-type region substantially aligned with said first edge of said first gate electrode, said second first conductivity-type dopant region more lightly net doped than said first first conductivity-type dopant region;

a first second conductivity-type dopant region in said substrate and abutting said first first-type dopant region and extending to the principal surface of the substrate, said first second conductivity-type region substantially aligned with said second edge of said first gate electrode;

a second gate electrode oxide layer over said first gate electrode;

a second gate electrode over said second gate electrode oxide layer and extending over said second first conductivity-type dopant region, said second gate electrode forming a control gate for said first gate electrode and a gate for a switching transistor, said second gate electrode having a first edge over first second conductivity-type dopant region; and a second second conductivity-type dopant region in said substrate and abutting said first first conductivity-type dopant region and said second first conductivity region and extending to the principal surface of the substrate, said second second conductivity-type dopant region substantially aligned with said second edge of said second gate electrode;

whereby said second second conductivity-type region and said first second conductivity-type dopant region respectively form a source and drain for said programming of said FPGA cell.

2. The programming element of said FPGA cell of claim 1 wherein said first gate electrode oxide layer is in the range of 200 to 400 Å.

3. The programming element of said FPGA cell of claim 1 wherein said second gate electrode oxide layer is in the range of 500 to 700 Å.

4. The programming element of claim 1 wherein said first first-type dopant region has a substantially uniform net dopant concentration across said principal surface.

5. The programming element of said FPGA cell of claim 4 wherein a net concentration of first-type dopants in said first first-type dopant region is approximately $2 \times 10^{17}$ dopants/cm$^3$.

6. The programming element of said FPGA cell of claim 5 wherein said first-type dopants comprise P-type dopants and said second-type dopants comprise N-type dopants.

7. The programming element of said FPGA cell of claim 6 wherein a net concentration of second-type dopants in said first second-type dopant region is approximately $1 \times 10^{16}$ dopants/cm$^3$.

8. The programming element of said FPGA cell of claim 1 wherein a threshold voltage for said access transistor is less than or approximately equal to 2V above to a source voltage.

9. The programming element of said FPGA cell of claim 1 wherein programming $V_{DS}$ is substantially equal to 4V.

* * * * *